United States Patent
Horng et al.

(10) Patent No.: US 8,546,829 B2
(45) Date of Patent: Oct. 1, 2013

(54) POSTS IN GLUE LAYER FOR GROUP-III NITRIDE LEDS

(75) Inventors: Ray-Hua Horng, Taichung (TW); Heng Liu, Sunnyvale, CA (US); Yi-An Lu, Chiayi (TW)

(73) Assignees: Phostek, Inc., Hsinchu (TW); NCKU Research and Development Foundation, Tainan (TW)

( * ) Notice: Subject to any disclaimer, the term of this patent is extended or adjusted under 35 U.S.C. 154(b) by 173 days.

(21) Appl. No.: 13/185,845

(22) Filed: Jul. 19, 2011

(65) Prior Publication Data
US 2013/0020597 A1 Jan. 24, 2013

(51) Int. Cl.
*H01L 33/00* (2010.01)
(52) U.S. Cl.
USPC ..................... 257/98; 257/E33.055
(58) Field of Classification Search
USPC ............................ 257/98, E33.055
See application file for complete search history.

(56) References Cited

U.S. PATENT DOCUMENTS

| 8,076,686 B2 * | 12/2011 | Yu et al. ............. 257/98 |
| 2009/0032830 A1 * | 2/2009 | Li ........................ 257/98 |
| 2011/0024783 A1 | 2/2011 | Horng et al. |

FOREIGN PATENT DOCUMENTS
TW I282183 6/2007

OTHER PUBLICATIONS

Wuu, Dong-Sing et al. "Light Extraction Enhancement of Sapphire-Free InGaN LEDs Using Single-and Double-Side Surface Roughening Techniques." Phys. Status Solidi C 6, No. S2, S869-S872 (2009).

* cited by examiner

*Primary Examiner* — Mark Prenty
(74) *Attorney, Agent, or Firm* — Huffman Law Group, P.C.

(57) ABSTRACT

A semiconductor light emitting device and a method for making the semiconductor light emitting device are described. The semiconductor light emitting device includes an epitaxial structure having a first type doped layer, a light emitting layer, and a second type doped layer. The epitaxial structure may further include an undoped layer. A substrate is bonded to at least one surface of the epitaxial structure with an adhesive layer. One or more posts are located in the adhesive layer. The posts may have different widths depending on the location of the posts and/or the posts may only be located under certain portions of the epitaxial structure.

19 Claims, 16 Drawing Sheets

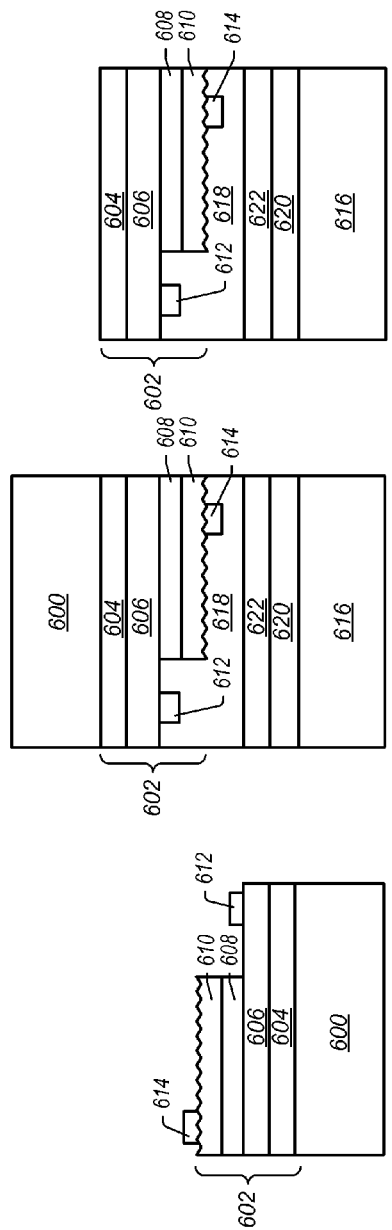
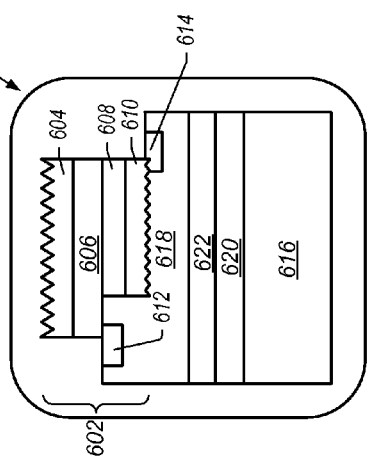
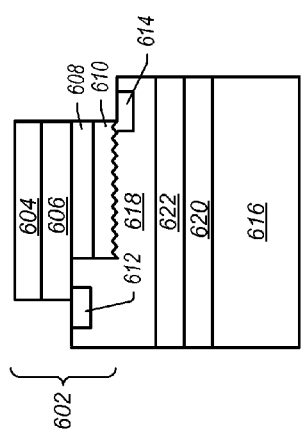
FIG. 6A  FIG. 6B  FIG. 6C  FIG. 6D  FIG. 6E

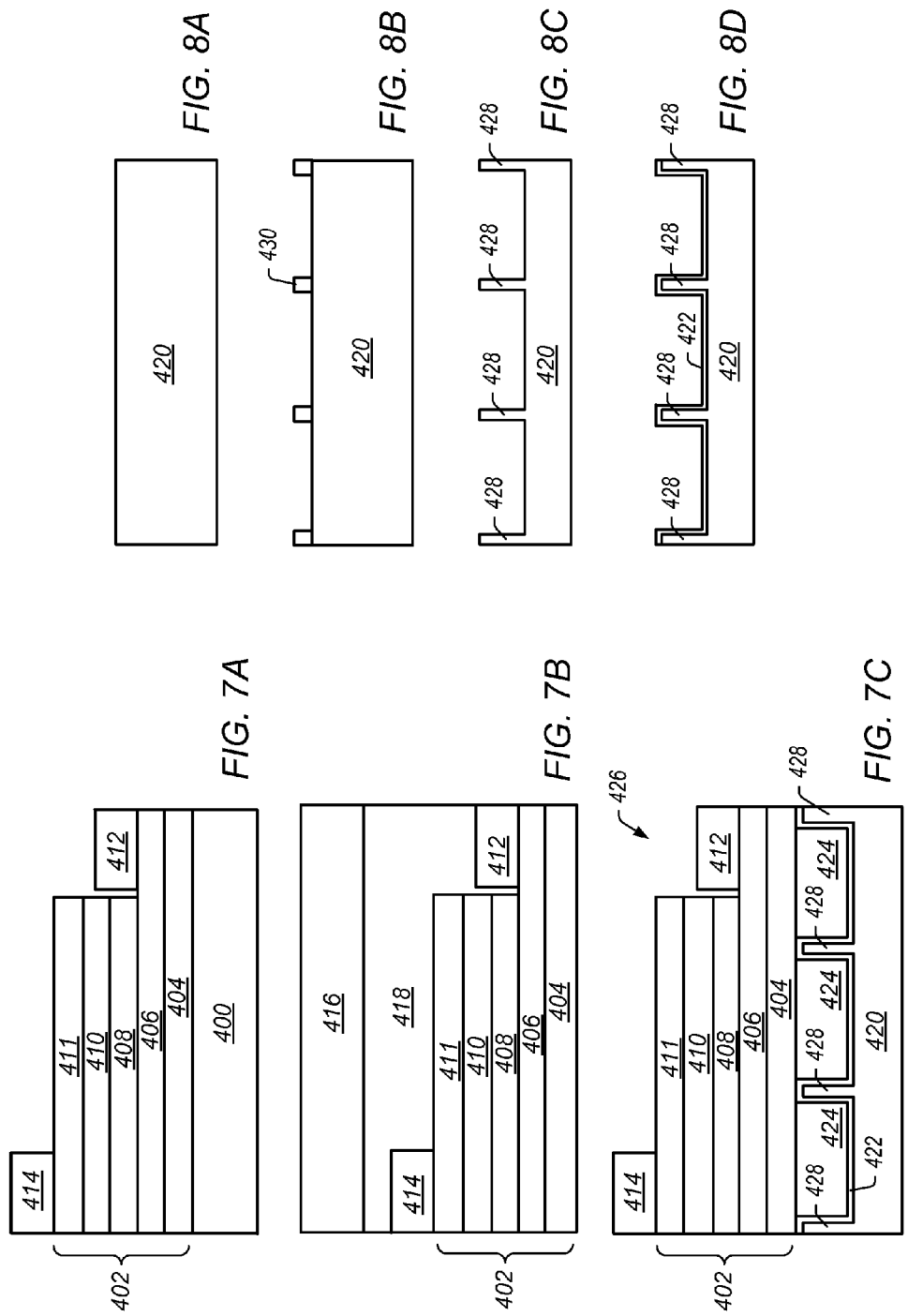

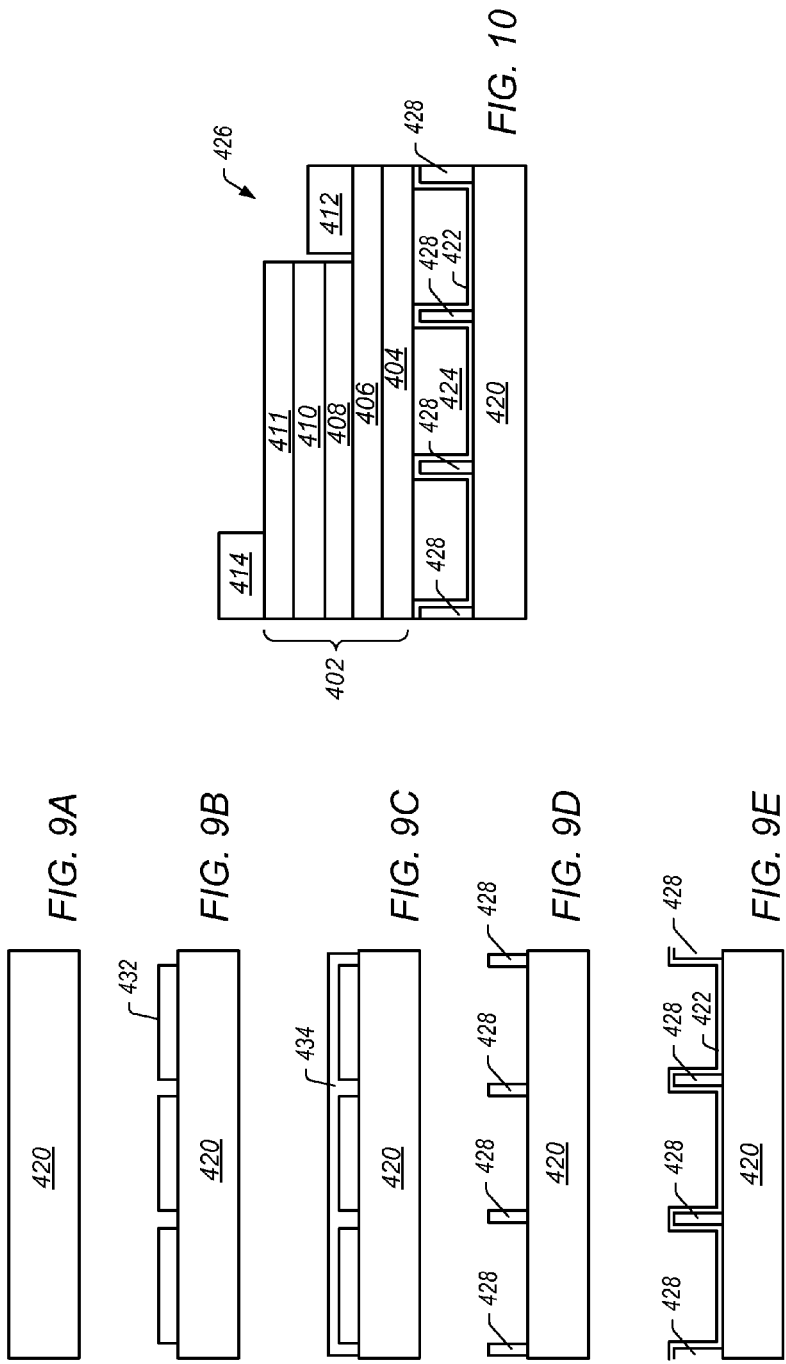

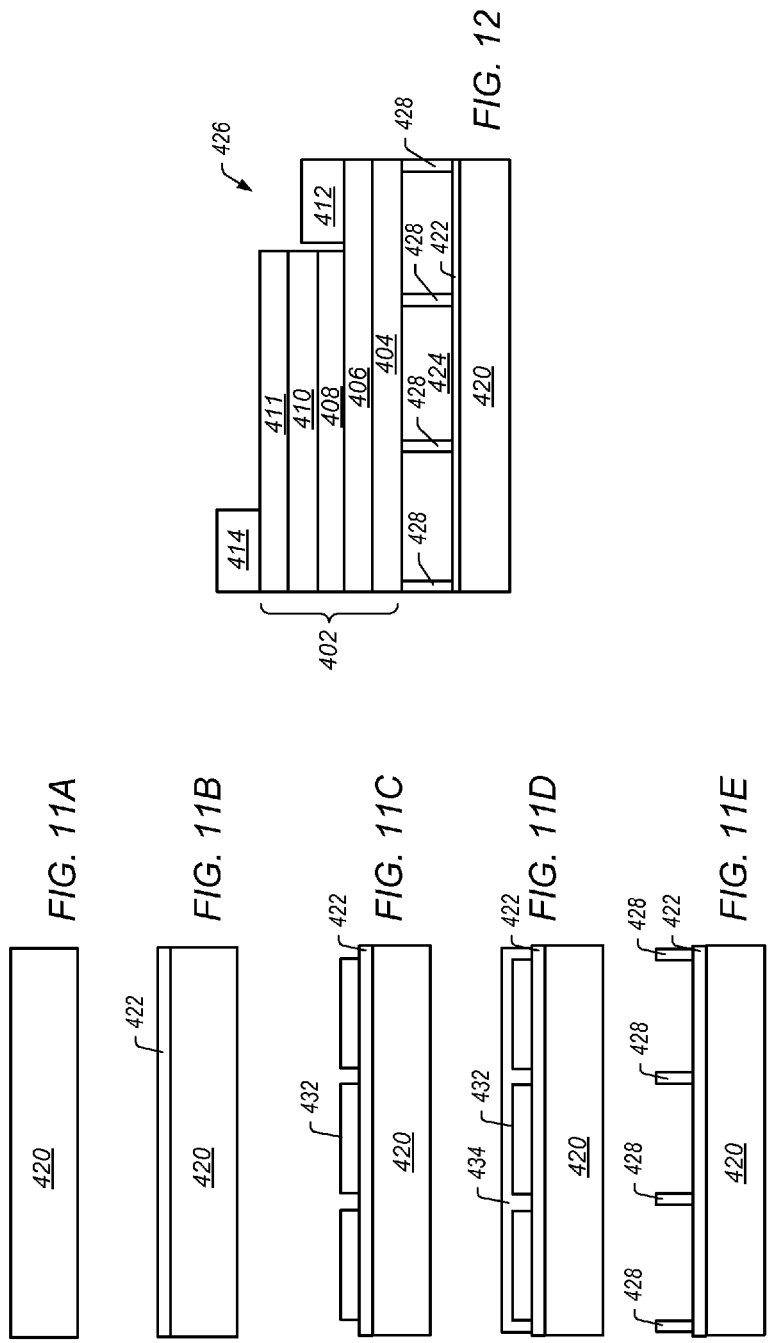

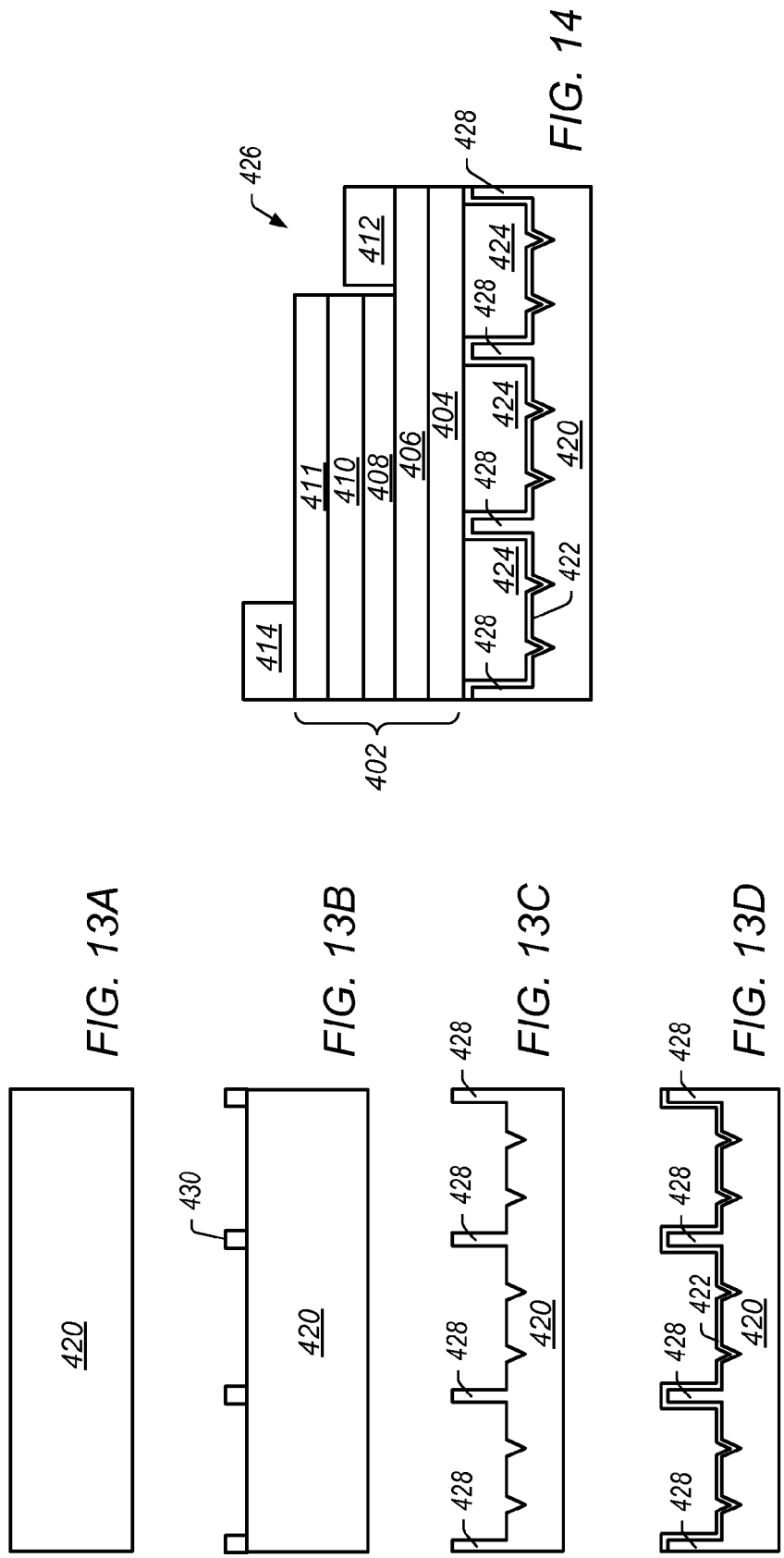

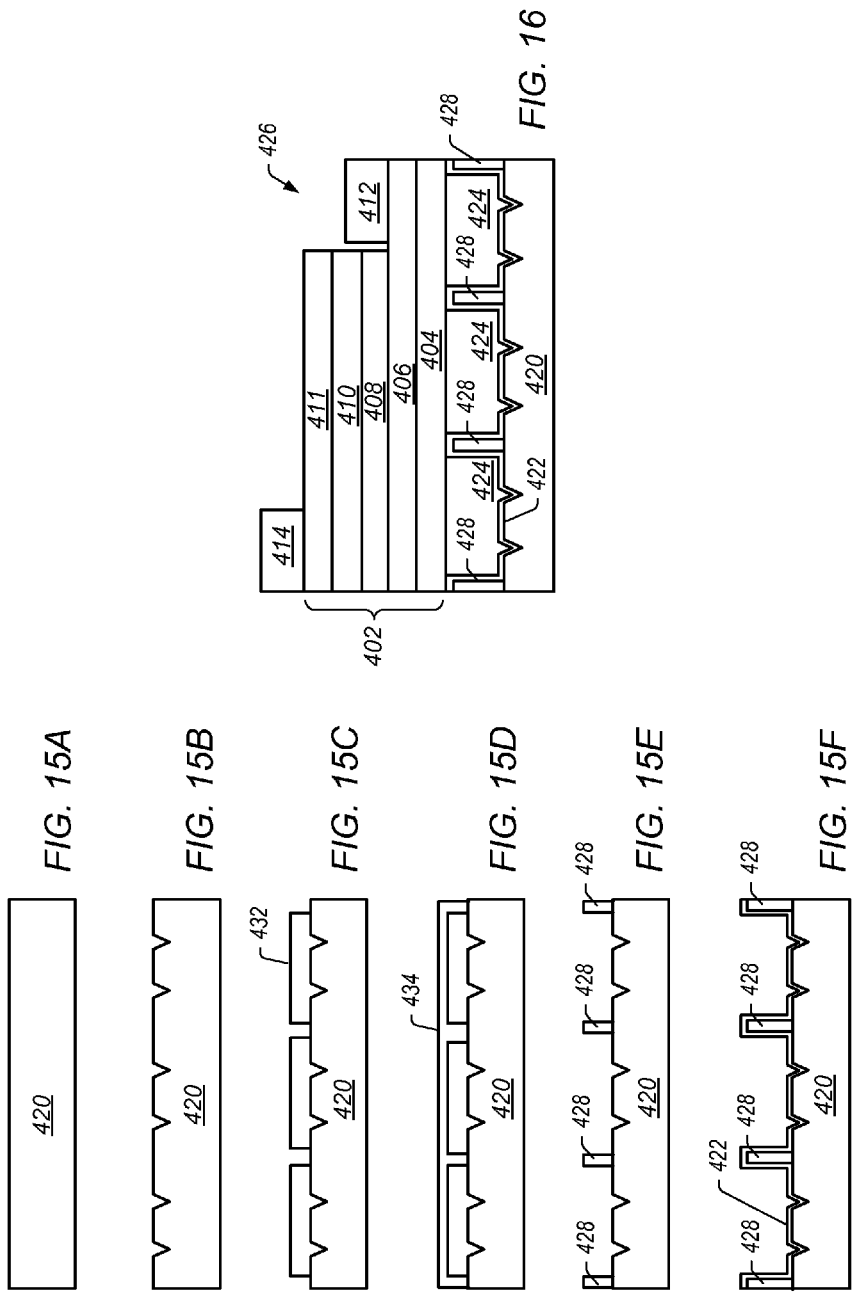

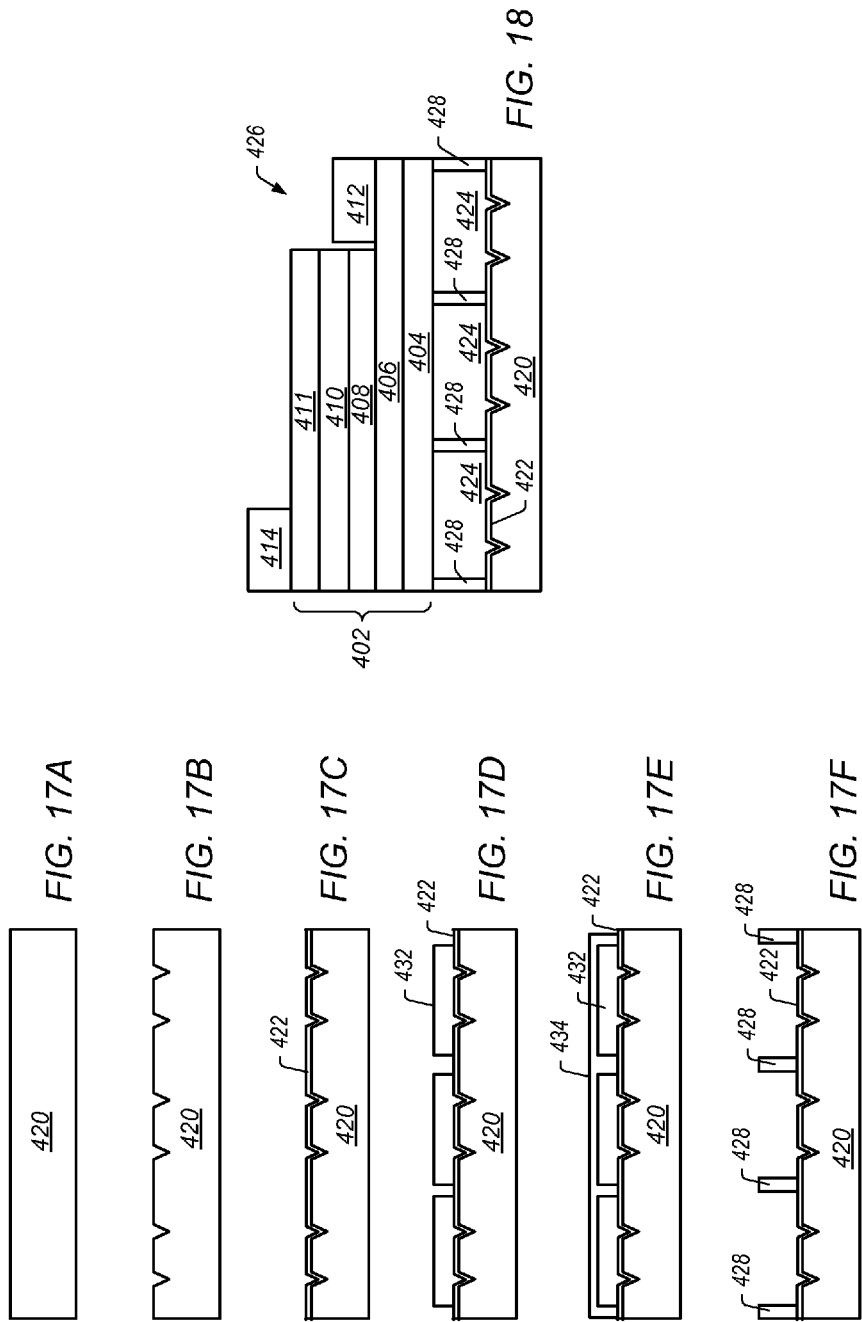

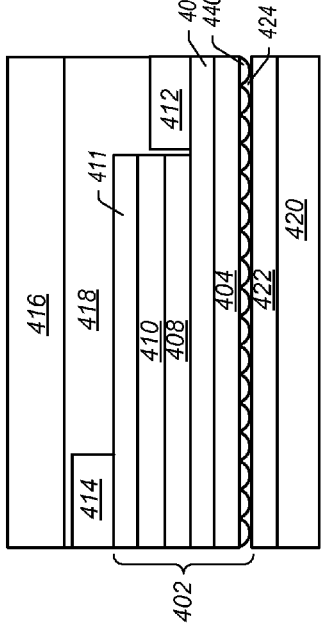
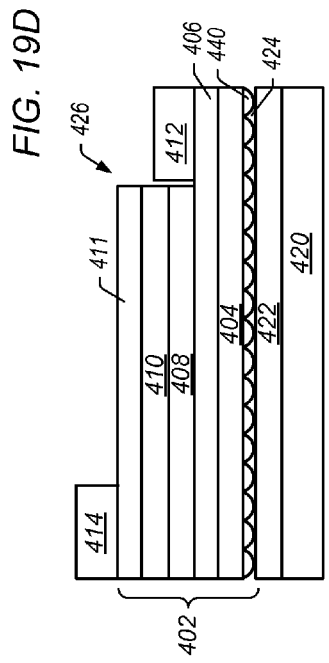
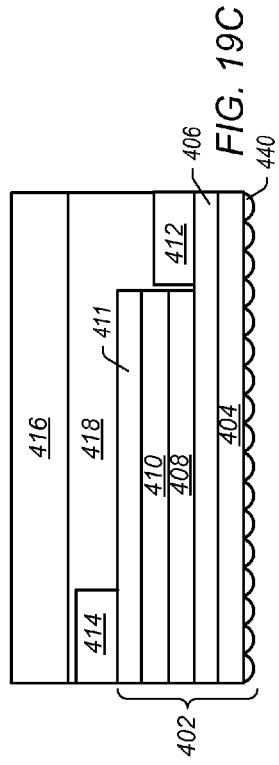
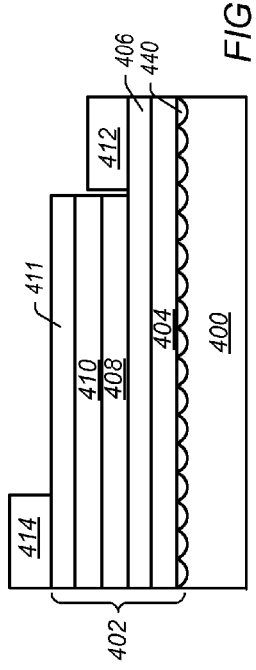
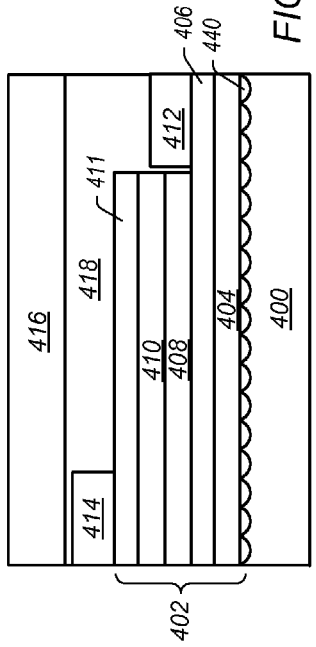

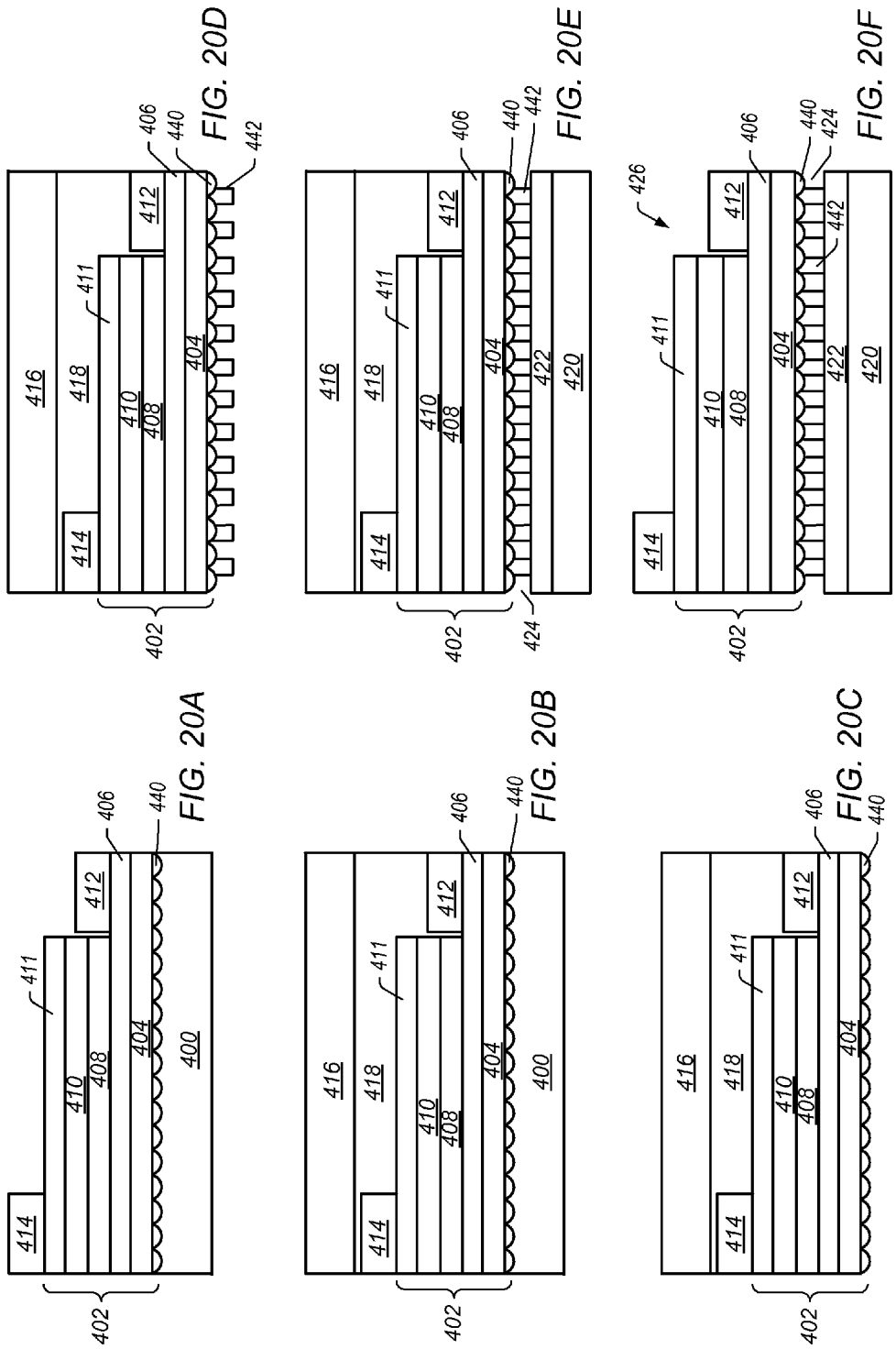

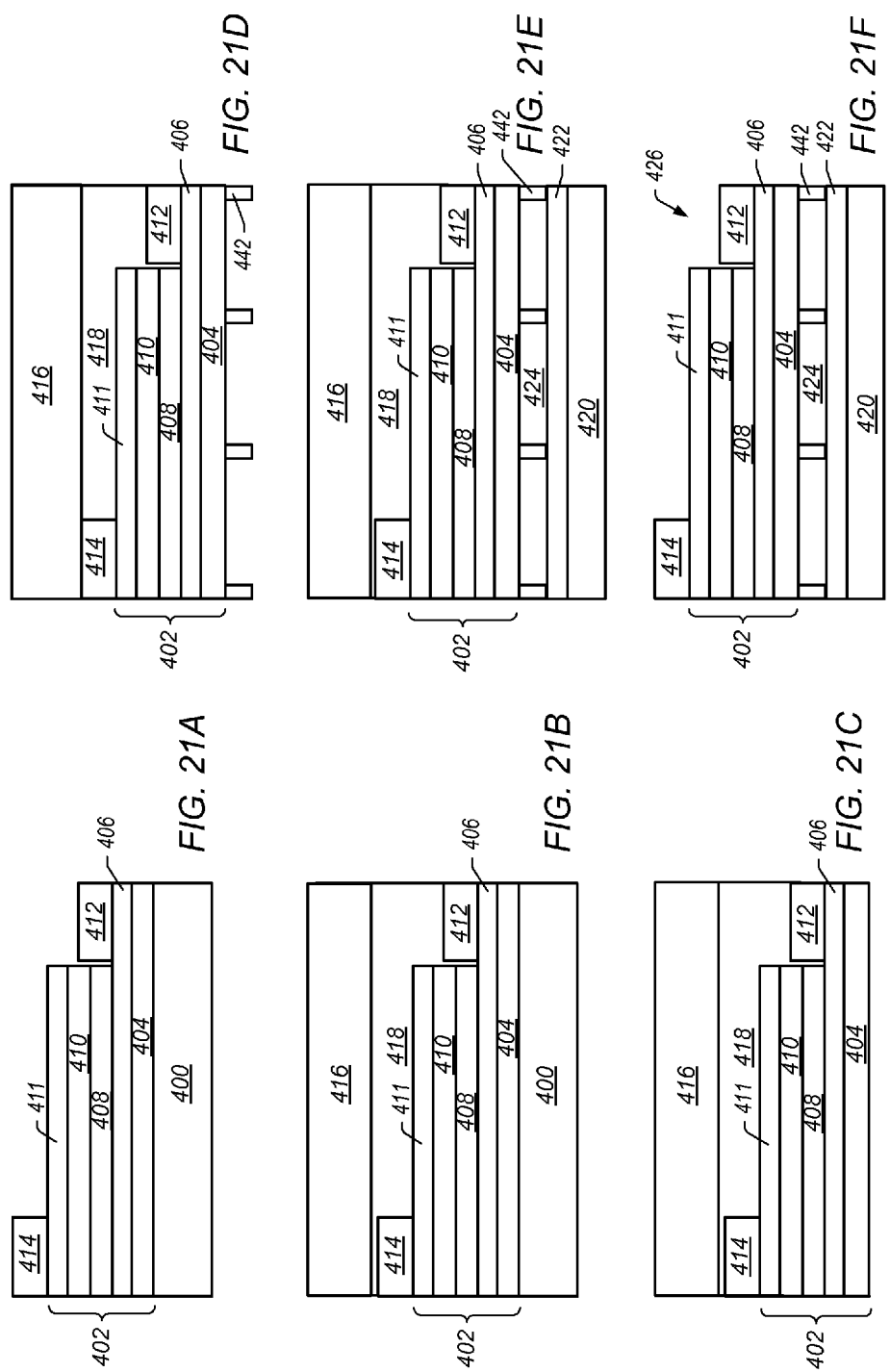

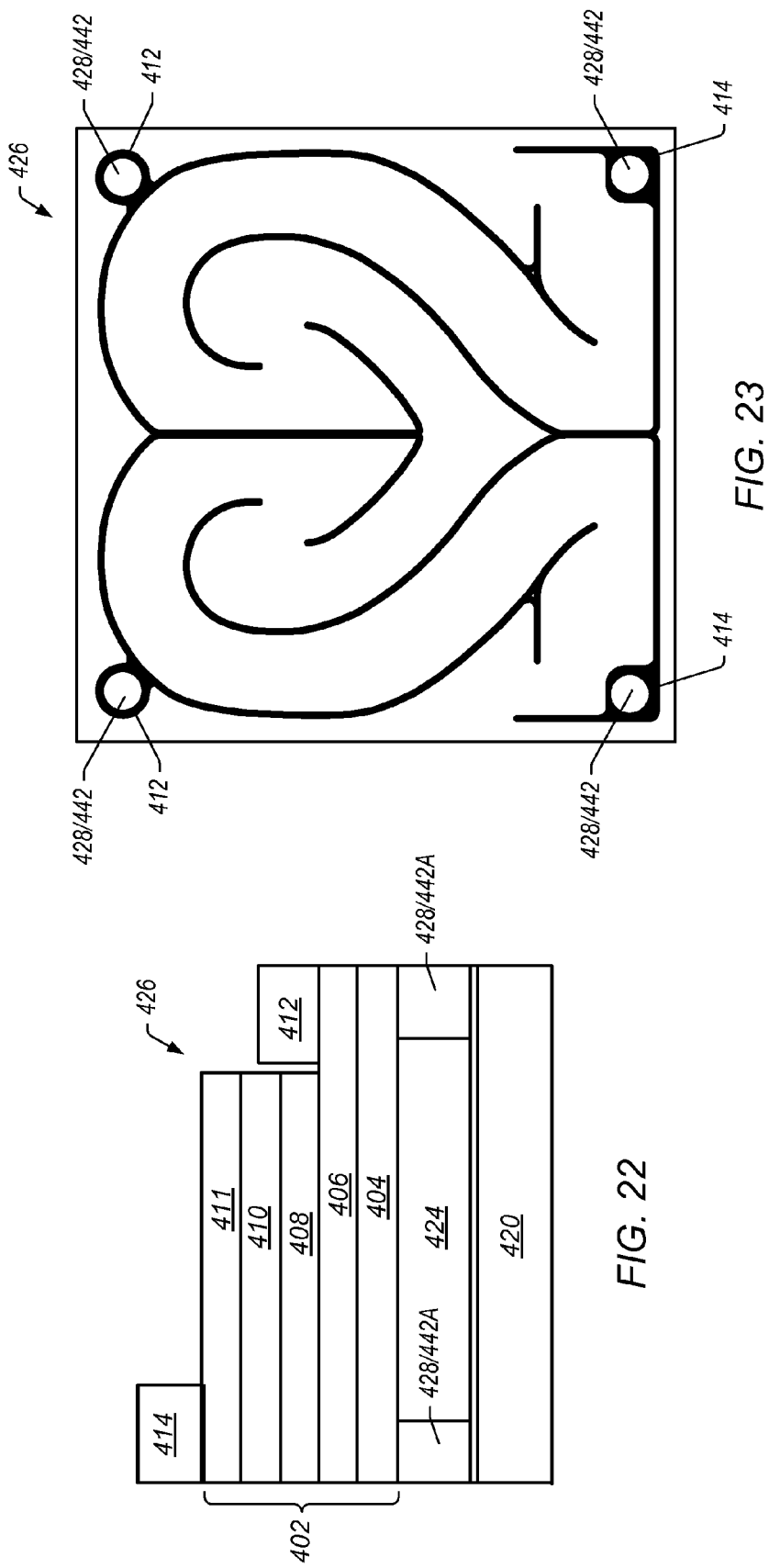

US 8,546,829 B2

POSTS IN GLUE LAYER FOR GROUP-III NITRIDE LEDS

BACKGROUND

1. Field of the Invention

The present invention relates to a semiconductor light emitting component, and more particularly to a light emitting diode (LED) array and a method for manufacturing the LED array.

2. Description of Related Art

FIG. 1 illustrates a schematic view of a conventional horizontal light emitting diode. Referring to FIG. 1, horizontal light emitting diode 100 includes epitaxial substrate 102. Epitaxial structure 104 is grown from the epitaxial substrate by an epitaxial growth process. Electrode unit 106 is formed on the epitaxial structure for providing electrical energy. Epitaxial substrate 102 is made of a material such as sapphire or SiC so that epitaxial growth of group-III nitride (e.g., gallium-nitride-based (GaN-based) or indium-gallium-nitride-based (InGaN-based) semiconductor material) can be achieved on epitaxial substrate 102.

Epitaxial structure 104 is usually made of GaN-based semiconductor material or InGaN-based semiconductor material. During the epitaxy growth process, GaN-based semiconductor material or InGaN-based semiconductor material epitaxially grows up from epitaxial substrate 102 to form n-type doped layer 108 and p-type doped layer 110. When the electrical energy is applied to epitaxial structure 108, light emitting portion 112 at junction of n-type doped layer 108 and p-type doped layer 110 generates an electron-hole capture phenomenon. As a result, the electrons of light emitting portion 112 will fall to a lower energy level and release energy with a photon mode. For example, light emitting portion 112 is a multiple quantum well (MQW) structure capable of restricting a spatial movement of the electrons and the holes. Thus, a collision probability of the electrons and the holes is increased so that the electron-hole capture phenomenon occurs easily, thereby enhancing light emitting efficiency.

Electrode unit 106 includes first electrode 114 and second electrode 116. First electrode 114 and second electrode 116 are in ohmic contact with n-type doped layer 108 and p-type doped layer 110, respectively. The electrodes are configured to provide electrical energy to epitaxial structure 104. When a voltage is applied between first electrode 114 and second electrode 116, an electric current flows from the second electrode to the first electrode through epitaxial substrate 102 and is horizontally distributed in epitaxial structure 104. Thus, a number of photons are generated by a photoelectric effect in epitaxial structure 104. Horizontal light emitting diode 100 emits light from epitaxial structure 104 due to the horizontally distributed electric current.

A manufacturing process of horizontal light emitting diode 100 is simple. However, horizontal light emitting diodes can cause several problems such as, but not limited to, current crowding problems, non-uniformity light emitting problems, and thermal accumulation problems. These problems may decrease the light emitting efficiency of the horizontal light emitting diode and/or damage the horizontal light emitting diode.

To overcome some of the above mentioned problems, vertical light emitting diodes have been developed. FIG. 2 illustrates a schematic view of a conventional vertical light emitting diode. Vertical light emitting diode 200 includes epitaxial structure 204 and electrode unit 206 disposed on the epitaxial structure for providing electrical energy. Similar to horizontal light emitting diode 100 shown in FIG. 1, epitaxial structure 204 can be made of GaN-based semiconductor material or InGaN-based semiconductor material by an epitaxial growth process. During the epitaxial growth process, the GaN-based semiconductor material and the InGaN-based semiconductor material epitaxially grows up from an epitaxial substrate (not shown) to form n-type doped layer 208, light emitting structure 212, and p-type doped layer 210. Then, electrode unit 206 is bonded to epitaxial structure 204 after stripping the epitaxial substrate. Electrode unit 206 includes first electrode 214 and second electrode 216. First electrode 214 and second electrode 216 are in ohmic contact with n-type doped layer 208 and p-type doped layer 210, respectively. In addition, second electrode 216 can adhere to heat dissipating substrate 202 so as to increase the heat dissipation efficiency. When a voltage is applied between first electrode 214 and second electrode 216, an electric current vertically flows. Thus, conventional vertical light emitting diode 200 can effectively improve the current crowding problem, the non-uniformity light emitting problem and the thermal accumulation problem of horizontal light emitting diode 100. However, a shading effect of the electrodes is a problem in the conventional vertical light emitting diode depicted in FIG. 2. In addition, the manufacturing process for forming vertical light emitting diode 200 may be complicated. For example, epitaxial structure 204 may be damaged by high heat when adhering second electrode 216 to heat dissipating substrate 202.

In recent years, wide-bandgap nitride-based LEDs with wavelength range from the ultraviolet to the shorter wavelength parts of the visible spectra have been developed. LED devices can be applied to new display technologies such as traffic signals, liquid crystal display TVs, and backlights of cell phones. Due to the lack of native substrates, GaN films and related nitride compounds are commonly grown on sapphire wafers. Conventional LEDs (such as those described above) are inefficient because the photons are emitted in all directions. A large fraction of light emitted is limited in the sapphire substrate and cannot contribute to usable light output. Moreover, the poor thermal conductivity of the sapphire substrate is also a problem associated with conventional nitride LEDs. Therefore, freestanding GaN optoelectronics without the use of sapphire is a desirable technology that solves this problem. The epilayer transferring technique is a well-known innovation in achieving ultrabright LEDs. Thin-film p-side-up GaN LEDs with highly reflective reflector on silicon substrate made by a laser lift-off (LLO) technique, combined with n-GaN surface roughening, have been established as an effective tool for nitride-based heteroepitaxial structures to eliminate the sapphire constraint. The structure is regarded as a good candidate for enhancing the light extraction efficiency of GaN-based LEDs. However, this technique is also subject to the electrode-shading problem. The emitted light is covered and absorbed by the electrodes, which results in reduced light efficiency.

Thin-film n-side-up devices GaN LEDs with interdigitated imbedded electrodes may improve light emission by reducing some of the electrode-shading problem. While thin-film n-side-up devices GaN LEDs provide enhanced properties compared to thin-film p-side-up devices GaN LEDs, there is still a need for improved structures and processes for making both p-side-up and n-side-up devices.

SUMMARY

In certain embodiments, a semiconductor light emitting device includes an epitaxial structure having a first type doped layer, a light emitting layer, and a second type doped layer. In some embodiments, the epitaxial structure also includes an undoped layer. A substrate may be bonded to at least one surface of the epitaxial structure with an adhesive layer. One or more posts (spacers) may be located in the adhesive layer. In some embodiments, the posts have different widths depending on the location of the posts. In some embodiments, the posts are only located under certain portions of the epitaxial structure.

In some embodiments, a height of one or more of the posts determines a thickness of the adhesive layer. In some embodiments, the posts are made of the same material as the substrate. In some embodiments, the posts have been formed as part of the substrate. In some embodiments, the posts are made of a conductive metal. In some embodiments, the posts are formed on the substrate prior to bonding the substrate to the epitaxial structure. In other embodiments, the post are formed on the epitaxial structure prior to bonding the epitaxial structure to the substrate.

In certain embodiments, a method for forming a semiconductor light emitting device includes providing an epitaxial structure on a temporary substrate. The epitaxial structure includes a first type doped layer, a light emitting layer, and a second type doped layer. In some embodiments, the epitaxial structure includes an undoped layer. A first surface of the epitaxial structure is coupled to the temporary substrate. One or more posts are formed on a surface of a permanent substrate. The surface of the permanent substrate with the posts is coupled to a second surface of the epitaxial structure with an adhesive layer. The second surface of the epitaxial structure is opposite the first surface of the epitaxial structure. The temporary substrate is then removed from the first surface of the epitaxial structure.

In certain embodiments, a method for forming a semiconductor light emitting device includes providing an epitaxial structure on a temporary substrate. The epitaxial structure includes a first type doped layer, a light emitting layer, and a second type doped layer. In some embodiments, the epitaxial structure includes an undoped layer. A first surface of the epitaxial structure is coupled to the temporary substrate. One or more posts are formed on a second surface of the epitaxial structure. The second surface of the epitaxial structure is opposite the first surface of the epitaxial structure. A permanent substrate is coupled to the second surface of the epitaxial structure with an adhesive layer. The temporary substrate is then removed from the first surface of the epitaxial structure.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which:

FIGS. 6A-E depict an embodiment of a method for making an n-side up LED.

FIGS. 7A-C depict an embodiment of a process for making a p-side up LED with posts in the adhesive layer between the substrate and the epitaxial structure.

FIGS. 8A-D depict an embodiment for making a substrate with posts and a reflective layer.

FIGS. 9A-E depict an embodiment for making a substrate with metal posts and a reflective layer.

FIG. 10 depicts an embodiment of a p-side up LED with a substrate having metal posts formed above the substrate.

FIGS. 11A-E depict an embodiment for making a substrate with a reflective layer under metal posts.

FIG. 12 depicts an embodiment of a p-side up LED with a substrate having metal posts formed above a reflective layer on the substrate.

FIGS. 13A-D depict an embodiment for making a roughened surface substrate with posts and a reflective layer.

FIG. 14 depicts an embodiment of a p-side up LED with a roughened substrate having posts formed from the substrate.

FIGS. 15A-F depict an embodiment for making a roughened surface substrate with metal posts and a reflective layer.

FIG. 16 depicts an embodiment of a p-side up LED with a roughened substrate having metal posts formed above the substrate.

FIGS. 17A-F depict an embodiment for making a roughened surface substrate with a reflective layer under metal posts.

FIG. 18 depicts an embodiment of a p-side up LED with a roughened substrate having metal posts formed above a reflective layer on the substrate.

FIGS. 19A-E depict an embodiment for making an epitaxial structure with protrusions on the undoped layer of the epitaxial structure.

FIGS. 20A-F depict an embodiment for making an epitaxial structure with posts and protrusions on the undoped layer of the epitaxial structure.

FIGS. 21A-F depict an embodiment for making an epitaxial structure with posts on the undoped layer of the epitaxial structure.

FIG. 22 depicts a side-view representation of an embodiment of an LED with posts located only under a first electrode and a second electrode on an epitaxial structure.

FIG. 23 depicts a top-view representation of the embodiment of an LED with posts located only under a first electrode and a second electrode on an epitaxial structure.

Figure 1:
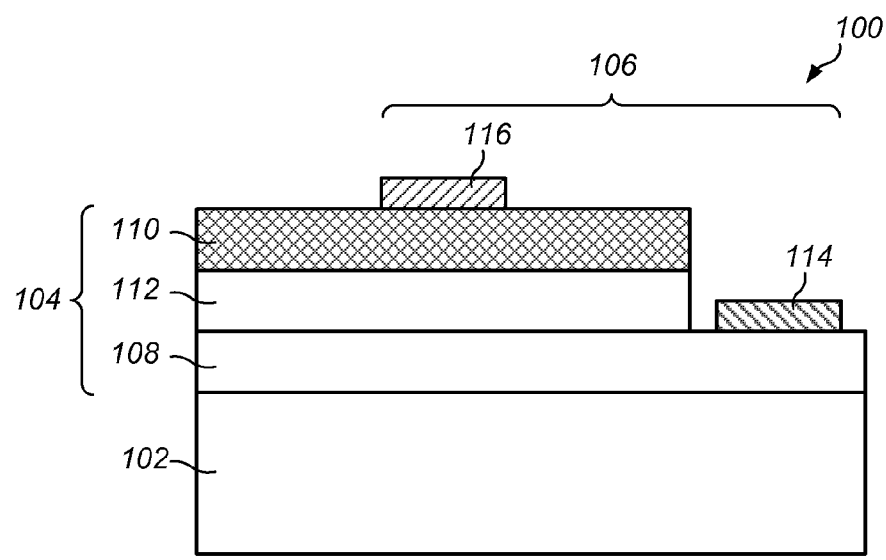
FIG. 1 illustrates a schematic view of a conventional horizontal light emitting diode.
Figure 2:
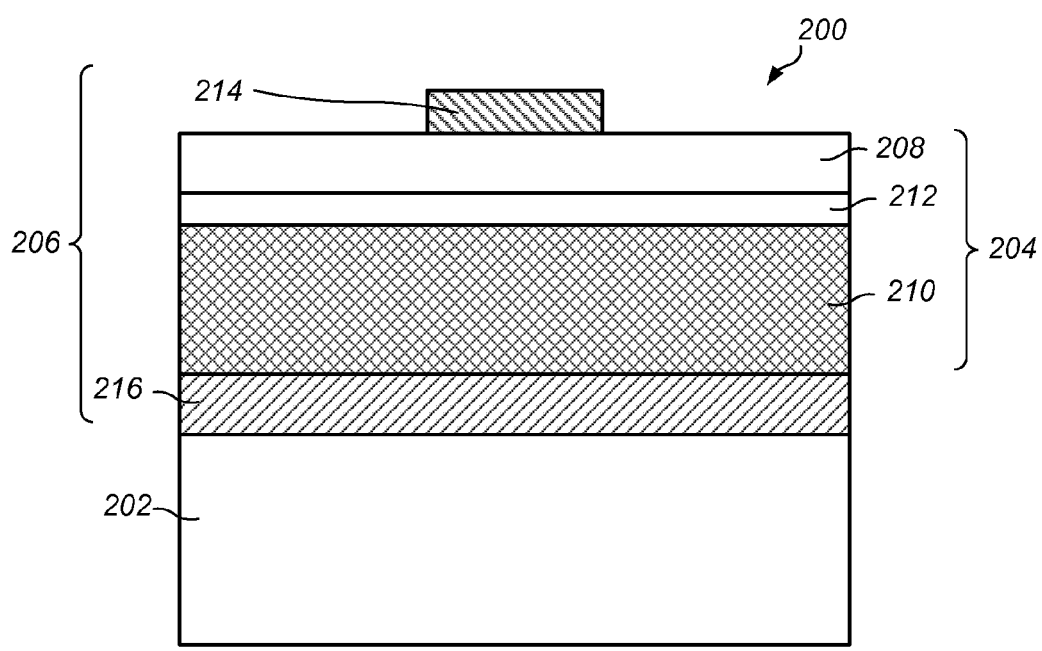
FIG. 2 illustrates a schematic view of a conventional vertical light emitting diode.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

In the context of this patent, the term "coupled" means either a direct connection or an indirect connection (e.g., one or more intervening connections) between one or more objects or components.

Figure 3:
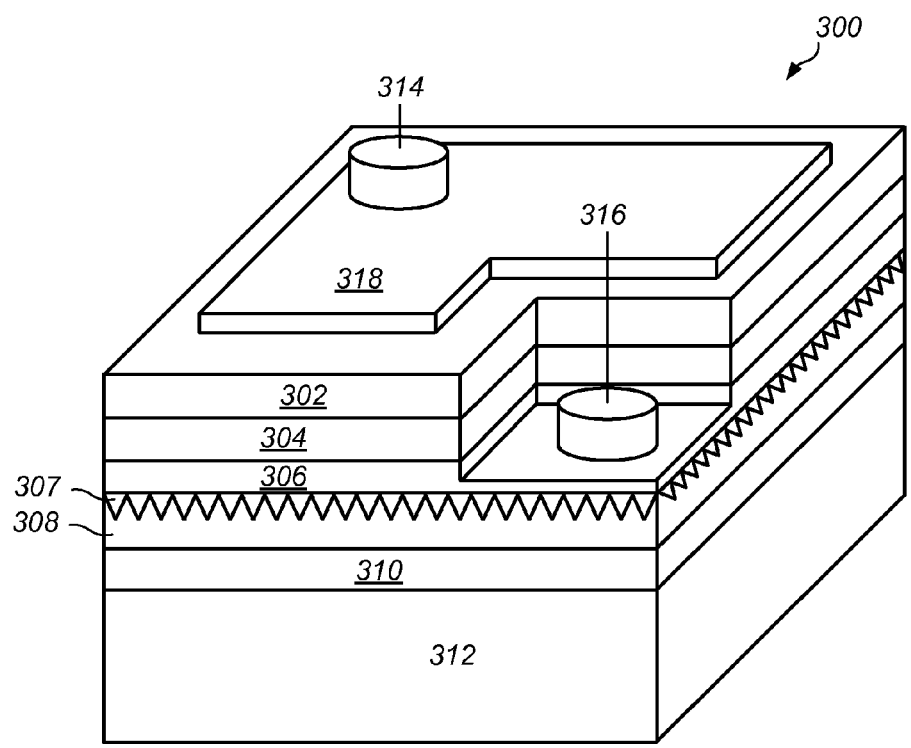
FIG. 3 depicts an embodiment of a p-side up thin film GaN (gallium nitride) LED.

FIG. 3 depicts an embodiment of a p-side up thin film GaN (gallium nitride) LED. P-side up LED 300 includes p-doped layer GaN layer 302, light emitting layer 304, and n-doped GaN layer 306. Light emitting layer 304 may be, for example, a multiple quantum well layer. In some embodiments, undoped GaN layer 307 is coupled to the bottom surface of n-doped layer 306. Layer 307 may be an epitaxial buffer layer. In some embodiments, layer 302 has a roughened upper surface and/or layer 307 has a roughened lower surface (e.g., a surface roughened by wet etching). Roughening of the surfaces may increase light emission efficiency of the layers.

The lower surface of layer 307 is bonded to reflective layer 310 with adhesive layer 308. Reflective layer 310 may be attached to substrate 312. Adhesive layer 308 may be a glue material with a low refractive index (e.g., refractive index of about 1.4). Reflective layer 310 may include a distributed Bragg reflector (DBR), an omni-directional reflector (ODR), silver, aluminum, titanium, and/or other reflective metals. Substrate 312 may include silicon, silicon oxide, metal, ceramic, polymer, or other suitable substrate materials with high thermal conductivity. Substrate 312 made of silicon may have a thermal conductivity of, for example, about 168 W/mK.

First electrode 314 and second electrode 316 may be formed on p-doped layer 302 and n-doped layer 306, respectively. Thus, first electrode 314 is a contact for layer 302 and second electrode 316 is a contact for layer 306. Because electrodes 314, 316 are formed on top of layers 302, 306, the electrodes may shade portions of the underlying layers and reduce the light emitting efficiency of LED 300. In some embodiments, layer 318 is formed on top of p-doped layer 302. Layer 318 may be a transparent conducting layer for current spreading. For example, layer 318 may include indium tin oxide (ITO). The upper surface of layer 318 may be roughened.

Figure 4A:
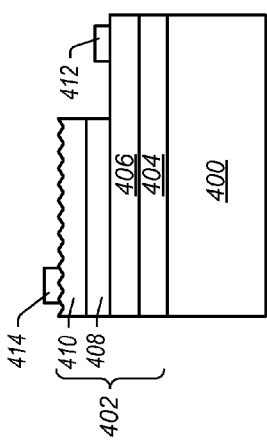
FIGS. 4A-F depict an embodiment of a method for making a p-side up LED.

FIGS. 4A-F depict an embodiment of a method for making a p-side up LED such as LED 300. FIG. 4A depicts epitaxial structure 402 formed on first substrate 400. First substrate 400 may be a temporary substrate such as a sapphire substrate. Epitaxial structure 402 may be formed on first substrate 400 using conventional epitaxial techniques known in the art such as metal organic chemical vapor deposition (MOCVD). Epitaxial structure 402 may include undoped layer 404, first doped layer 406, light emitting layer 408, and second doped layer 410. In certain embodiments, undoped layer 404, first doped layer 406, light emitting layer 408, and second doped layer 410 are gallium nitride (GaN) layers formed in multiple deposition processing steps.

Light emitting layer 408 may be, for example, a multiple quantum well layer. In certain embodiments, first doped layer 406 is an n-type doped layer and second doped layer 410 is a p-type doped layer. In some embodiments, the upper surface of second doped layer 410 is roughened by, for example, wet etching. A portion of the upper surface of first doped layer 406 may be exposed by patterning of light emitting layer 408 and second doped layer 410. First electrode 412 may be formed on an upper surface of first doped layer 406. Second electrode 414 may be formed on an upper surface of second doped layer 410. The size and shape of electrodes 412 and 414 may be defined using a photolithography process.

Figure 4B:
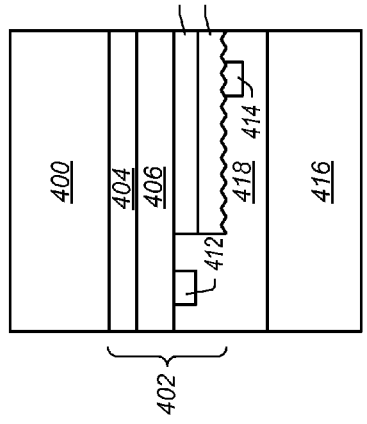

After formation of epitaxial structure 402 on first substrate 400, the upper surface of the structure may be bonded to second substrate 416 with first adhesive layer 418, as shown in FIG. 4B. Before or after the bonding process, the device may be flipped upside down, as shown in FIG. 4B, such that undoped layer 404 is at the top of epitaxial structure 402 and second doped layer 410 is at the bottom of the structure. Second substrate 416 may be a temporary substrate (for example, a glass substrate, sapphire, or other insulating material type substrate). First adhesive layer 418 may be, for example, epoxy glue, wax, SOG (spin-on-glass), photoresist, monomer, polymer, or any glue type material known in the art for bonding GaN layers to ceramic or glass layers. In certain embodiments, epitaxial structure 402 is bonded to second substrate 416 using first adhesive layer 418 at temperatures between about 200° C. and about 300° C. and pressures between about 5 kg force and about 30 kg force for a 2 inch substrate.

Figure 4C:
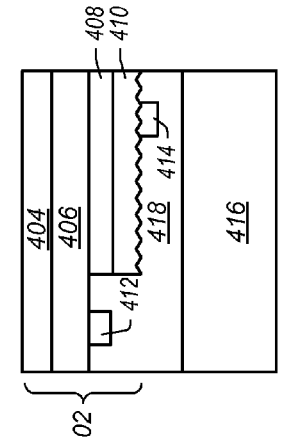
Figure 4D:
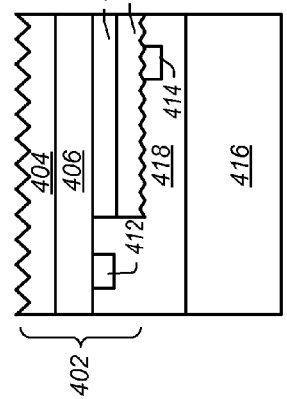

Following bonding to second substrate 416, first substrate 400 is removed from epitaxial structure 402, as shown in FIG. 4C. First substrate 400 may be removed using, for example, a laser lift-off (LLO) process. Removal of first substrate 400 exposes the, now, upper surface of undoped layer 404. In certain embodiments, upper surface of undoped layer 404 is roughened, as shown in FIG. 4D. The upper surface of undoped layer 404 may be roughened using, for example, a wet etching process.

Figure 4E:
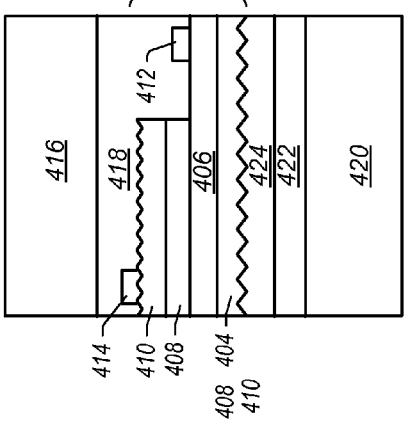

The structure depicted in FIG. 4D may then be bonded to third substrate 420 with second adhesive layer 424, as shown in FIG. 4E. Before or after the bonding process, the device may be flipped upside down, as shown in FIG. 4E, such that third substrate 420 is at the bottom of the structure. In certain embodiments, third substrate 420 includes reflective layer 422 on an upper surface of the substrate. Third substrate 420 may be, for example, a silicon substrate or other suitable thermally conductive substrate. Third substrate 420 may be the permanent substrate for epitaxial structure 402. Reflective layer 422 may include distributed Bragg reflector (DBR), omni-directional reflector (ODR), silver, aluminum, titanium, and/or other reflective conducting materials. Second adhesive layer 424 may be the same or different from first adhesive layer 418. For example, in some embodiments, first adhesive layer 418 is an ether-based compound and second adhesive layer 424 is a silicone-based or imide-based compound. In certain embodiments, bonding with second adhesive layer 418 occurs at temperatures between about 150° C. and about 200° C. and pressures between about 300 kg force and about 400 kg force for a 2 inch substrate.

Figure 4F:
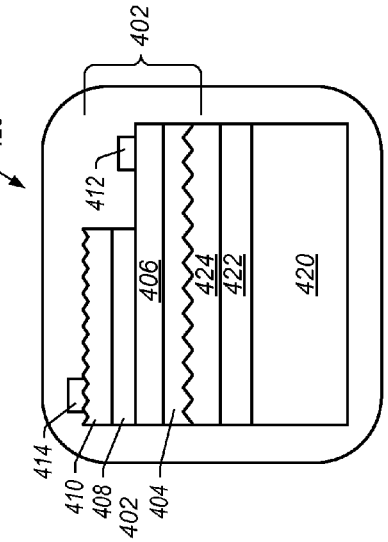

Following bonding to third substrate 420, first adhesive layer 418 is removed from epitaxial structure 402 to remove the first adhesive layer and second substrate 416 from the epitaxial structure, as shown in FIG. 4F. First adhesive layer 418 and second substrate 416 may be removed using, for example, a LLO process, an acid etching process, or another suitable etching process. The resulting structure, shown in FIG. 4F, is p-side up LED 426. P-side up LED 426 is an LED with second doped (p-type doped) layer 410 at the top of epitaxial structure 402 and electrodes 412, 414 exposed for use as contact pads.

Figure 5:
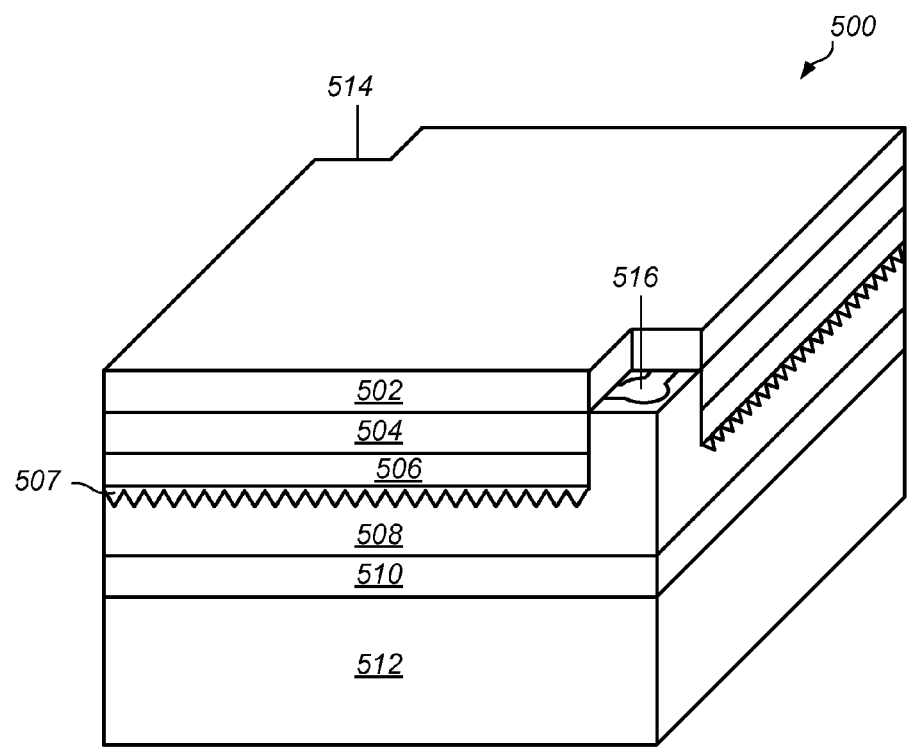
FIG. 5 depicts an embodiment of an n-side up thin film GaN (gallium nitride) LED.

FIG. 5 depicts an embodiment of an n-side up thin film GaN (gallium nitride) LED. N-side up LED 500 includes n-doped layer GaN layer 502, light emitting layer 504, and p-doped GaN layer 506. Light emitting layer 504 may be, for example, a multiple quantum well layer. In some embodiments, undoped GaN layer 507 is coupled to the bottom surface of p-doped layer 506. Layer 507 may be an epitaxial buffer layer. In some embodiments, layer 502 has a roughened upper surface and/or layer 507 has a roughened lower surface (e.g., a surface roughened by wet etching). Roughening of the surfaces may increase light emission efficiency of the layers.

The lower surface of layer 507 is bonded to reflective layer 510 with adhesive layer 508. Reflective layer 510 may be attached to substrate 512. Adhesive layer 508 may be a glue material with a low refractive index (e.g., refractive index of about 1.4). Reflective layer 510 may include distributed Bragg reflector (DBR), omni-directional reflector (ODR), silver, aluminum, titanium, and/or other reflective metals. Substrate 512 may include silicon, silicon oxide, metal, ceramic, polymer, or other suitable substrate materials with high thermal conductivity. Substrate 512 made of silicon may have a thermal conductivity of, for example, about 168 W/mK.

First electrode 514 and second electrode 516 may be formed on p-doped layer 506 and n-doped layer 502, respectively. Thus, first electrode 514 is a contact for layer 506 and second electrode 516 is a contact for layer 502. Electrodes 514, 516 may be imbedded in LED 500 such that there is no electrode shading, thus increasing the emission efficiency of the LED.

FIGS. 6A-E depict an embodiment of a method for making an n-side up LED such as LED 500. FIG. 6A depicts epitaxial structure 602 formed on first substrate 600 (e.g., a temporary substrate). First substrate 600 may be, for example, a sapphire substrate. Epitaxial structure 602 may be formed on first substrate 600 using conventional epitaxial techniques known in the art such as metal organic chemical vapor deposition (MOCVD). Epitaxial structure 602 may include undoped layer 604, first doped layer 606, light emitting layer 608, and second doped layer 610. In certain embodiments, undoped layer 604, first doped layer 606, light emitting layer 608, and second doped layer 610 are gallium nitride (GaN) layers formed in multiple deposition processing steps.

Light emitting layer 608 may be, for example, a multiple quantum well layer. In certain embodiments, first doped layer 606 is an n-type doped layer and second doped layer 610 is a p-type doped layer. In some embodiments, the upper surface of second doped layer 610 is roughened by, for example, wet etching. A portion of the upper surface of first doped layer 606 may be exposed by patterning of light emitting layer 608 and second doped layer 610. First electrode 612 may be formed on an upper surface of first doped layer 606. Second electrode 614 may be formed on an upper surface of second doped layer 610. The size and shape of electrodes 612 and 614 may be defined using a photolithography process.

After formation of epitaxial structure 602 on first substrate 600, the upper surface of the structure may be bonded to second substrate 616 with first adhesive layer 618, as shown in FIG. 6B. Before or after the bonding process, the device may be flipped upside down, as shown in FIG. 6B, such that undoped layer 604 is at the top of epitaxial structure 602 and second doped layer 610 is at the bottom of the structure. Second substrate 616 may be, for example, a silicon substrate or other suitable thermally conductive substrate. Second substrate 616 may be the permanent substrate for epitaxial structure 602. In certain embodiments, second substrate 616 includes reflective layer 620 and/or insulating layer 622 on an upper surface of the substrate. Reflective layer 620 may include distributed Bragg reflector (DBR), omni-directional reflector (ODR), silver, aluminum, titanium, and/or other reflective conducting materials. Insulating layer 622 may include oxides, nitrides, and/or other suitable electrically insulating materials with high light transparency. First adhesive layer 618 may be, for example, epoxy glue, wax, SOG (spin-on-glass), photo resist, monomer, polymer, or any glue type material known in the art for bonding GaN layers to silicon, silicon oxide, metal, ceramic, or polymer layers.

Following bonding to second substrate 616, first substrate 600 is removed from epitaxial structure 602, as shown in FIG. 6C. First substrate 600 may be removed using, for example, a laser lift-off (LLO) process. Removal of first substrate 600 exposes the, now, upper surface of undoped layer 604.

Following removal of first substrate 600, portions of undoped layer 604 and first doped layer 606, light emitting layer 608, and second doped layer 610 are removed to expose at least part of first electrode 612 and at least part of second electrode 614, as shown in FIG. 6D. Portions of undoped layer 604 and first doped layer 606 may be removed using, for example, an anisotropic etching process such as inductively coupled plasma (ICP) reactive ion etching (RIE).

In certain embodiments, upper surface of undoped layer 604 is roughened, as shown in FIG. 6E. The upper surface of undoped layer 604 may be roughened using, for example, a wet etching process (e.g., a sodium hydroxide wet-etching process or a phosphoric acid wet etching process). The resulting structure, shown in FIG. 6E, is n-side up LED 624. N-side up LED 624 is an LED with first doped (n-type doped) layer 610 at the top of epitaxial structure 602 and electrodes 612, 614 exposed for use as contact pads with the electrodes not shading light emitting layer 608.

One of the issues involved with the processes depicted in FIGS. 4A-F and FIGS. 6A-E is controlling the thickness of the adhesive layers. During the bonding process using the adhesive layer, the temperature is elevated (e.g., temperatures above about 200° C.) to allow the adhesive material (e.g., the epoxy glue) to flow. In addition, pressure is applied (e.g., pressures of at least about 9.8 MPa) to the device to promote bonding between the epitaxial structure and the substrate. Because of the viscosity of the adhesive material, it can be difficult to precisely control the thickness of the adhesive layer. Precise control of the thickness of the adhesive layer may provide for consistency in the thickness of the adhesive layer from sample to sample and/or process to process.

A possible solution for precisely controlling the thickness of the adhesive layer is through the use of posts or spacers in the adhesive layer that determine the thickness of the adhesive layer by maintaining a selected distance between the permanent substrate and the epitaxial structure during the bonding process. FIGS. 7A-C depict an embodiment of a process for making a p-side up LED with posts in the adhesive layer between the substrate and the epitaxial structure. FIGS. 7A-C depict an embodiment of a process similar to the embodiment depicted in FIGS. 4A-F. However, for simplicity, some of the steps of the process depicted in FIGS. 4A-F have been omitted from the process depicted in FIGS. 7A-C.

FIG. 7A depicts epitaxial structure 402 formed on first substrate 400. First substrate 400 may be, for example, a sapphire substrate. Epitaxial structure 402 may include undoped layer 404, first doped layer 406, light emitting layer 408, and second doped layer 410. Light emitting layer 408 may be, for example, a multiple quantum well layer. In certain embodiments, first doped layer 406 is an n-type doped layer and second doped layer 410 is a p-type doped layer. In some embodiments, portion 411 of the upper surface of second doped layer 410 is roughened by, for example, wet etching.

First electrode 412 is formed on an upper surface of first doped layer 406. Second electrode 414 is formed on an upper surface of second doped layer 410. After formation of epitaxial structure 402 on first substrate 400, the upper surface of the structure may be bonded to second substrate 416 with first adhesive layer 418, as shown in FIG. 7B. Second substrate

416 may be, for example, a glass substrate, sapphire, or other insulating material type substrate.

Following bonding to second substrate 416, first substrate 400 is removed from epitaxial structure 402, as shown in FIG. 7B. First substrate 400 may be removed using, for example, a laser lift-off (LLO) process. Removal of first substrate 400 exposes the surface of undoped layer 404. In some embodiments, the surface of undoped layer 404 is roughened.

The structure depicted in FIG. 7B may then be bonded to third substrate 420 with second adhesive layer 424, as shown in FIG. 7C. Third substrate 420 may be, for example, a silicon substrate or other suitable thermally conductive substrate. Third substrate 420 may be the permanent substrate for epitaxial structure 402. Following bonding to third substrate 420, first adhesive layer 418 is removed from epitaxial structure 402 to remove the first adhesive layer and second substrate 416 from the epitaxial structure.

As shown in FIG. 7C, third substrate 420 includes one or more posts 428. Posts 428 have a height that is the desired (selected) thickness of second adhesive layer 424. Posts 428 contact the surface of third substrate 420 such that the posts define the distance between undoped layer 404 and the substrate. Posts 428 maintain the distance between undoped layer 404 and third substrate 420 during the bonding process using second adhesive layer 424. Thus, the height of posts 428 determines the thickness of second adhesive layer 424.

In certain embodiments, third substrate 420 and/or posts 428 include reflective layer 422. Reflective layer 422 may include distributed Bragg reflector (DBR), omni-directional reflector (ODR), silver, aluminum, titanium, and/or other reflective conducting materials. Second adhesive layer 424 may be an epoxy glue, wax, SOG (spin-on-glass), photo resist, monomer, or polymer.

FIGS. 8A-D depict an embodiment for making substrate 420 with posts 428 and reflective layer 422. FIG. 8A depicts an embodiment of substrate 420. Substrate 420 may include one or any combination of the following group: silicon, silicon oxide, metal, ceramic, and polymer. FIG. 8B depicts an embodiment of mask 430 on substrate 420. Mask 430 may be a photoresist layer patterned using any photolithography technique known in the art. With mask 430 on substrate 420, substrate 420 is etched using a dry or wet etching process to form posts 428, as shown in FIG. 8C. Mask 430 is removed following the substrate etching process, as shown in FIG. 8C. Following formation of posts 428, reflective layer 422 is formed over the posts and substrate 420, as shown in FIG. 8D. Substrate 420 with posts 428 formed from substrate material depicted in FIG. 8D is then used as third substrate 420 depicted in FIG. 7C.

In some embodiments, posts 428 are made from materials other than substrate material. For example, posts 428 may be made from metal or another suitable material. FIGS. 9A-E depict an embodiment for making substrate 420 with metal posts 428 and reflective layer 422. FIG. 9A depicts an embodiment of substrate 420. FIG. 9B depicts an embodiment of mask 432 on substrate 420. Mask 432 may be a photoresist layer patterned using any photolithography technique known in the art. With mask 432 on substrate 420, metal layer 434 is formed on substrate 420 and mask 432, as shown in FIG. 9C. Metal layer 434 may be, for example, aluminum, titanium, other suitable metals, other suitable post material, and/or combinations thereof.

Following deposition of metal layer 434, a lift off process is used to remove mask 432 and portions of metal layer 434 formed above the mask, as shown in FIG. 9D. The lift off process may be a chemical etching process (e.g., a wet etching process) that removes the mask material from substrate 420. The lift off process leaves posts 428 formed from metal layer 434. Following formation of posts 428, reflective layer 422 is formed over posts 428 and substrate 420, as shown in FIG. 9E. FIG. 10 depicts an embodiment of p-side up LED 426 with substrate 420 having metal posts 428 formed above the substrate.

In some embodiments, reflective layer 422 is formed below metal posts 428 on substrate 420 (e.g., the reflective layer is between the posts and the substrate). FIGS. 11A-E depict an embodiment for making substrate 420 with reflective layer 422 under metal posts 428. FIG. 11A depicts an embodiment of substrate 420. Reflective layer 422 is formed over substrate 420, as shown in FIG. 11B. Mask 432 is formed on reflective layer 422, as shown in FIG. 11C. With mask 432 on reflective layer 422, metal layer 434 is formed over the reflective layer and the mask, as shown in FIG. 11D.

Following deposition of metal layer 434, a lift off process is used to remove mask 432 and portions of metal layer 434 formed above the mask, as shown in FIG. 11E. The lift off process leaves posts 428 formed from metal layer 434 above reflective layer 422 on substrate 420. FIG. 12 depicts an embodiment of p-side up LED 426 with substrate 420 having metal posts 428 formed above reflective layer 422 on the substrate.

In some embodiments, the surface of substrate 420 between posts 428 is roughened. Roughening the substrate may increase the efficiency of p-side up LED 426. FIGS. 13A-D depict an embodiment for making a roughened surface substrate 420 with posts 428 and reflective layer 422. The steps depicted in FIGS. 13A-D are similar to the steps depicted in FIGS. 8A-D with the addition of the roughening step.

FIG. 13A depicts an embodiment of substrate 420. FIG. 13B depicts an embodiment of mask 430 on substrate 420. With mask 430 on substrate 420, substrate 420 is etched using a dry or wet etching process to form posts 428, as shown in FIG. 13C. During the etching process or during using another etch process, substrate 420 is etched to roughen the surface of the substrate between posts 428. For example, substrate 420 may be overetched at least partially to roughen the surface of the substrate. Mask 430 is removed following the substrate etching process, as shown in FIG. 13C. Following formation of posts 428, reflective layer 422 is formed over posts 428 and substrate 420, as shown in FIG. 13D. FIG. 14 depicts an embodiment of p-side up LED 426 with roughened substrate 420 having posts 428 formed from the substrate.

FIGS. 15A-F depict an embodiment for making a roughened surface substrate 420 with metal posts 428 and reflective layer 422. The steps depicted in FIGS. 15A-F are similar to the steps depicted in FIGS. 9A-E with the addition of the roughening step. FIG. 15A depicts an embodiment of substrate 420. FIG. 15B depicts roughening of substrate 420 using a dry and/or wet etching process. FIG. 15C depicts an embodiment of mask 432 on substrate 420. Mask 432 may be a photoresist layer patterned using any photolithography technique known in the art. With mask 432 on substrate 420, metal layer 434 is formed on substrate 420 and mask 432, as shown in FIG. 15D.

Following deposition of metal layer 434, a lift off process is used to remove mask 432 and portions of metal layer 434 formed above the mask, as shown in FIG. 15E. The lift off process leaves posts 428 formed from metal layer 434. Following formation of posts 428, reflective layer 422 is formed over posts 428 and substrate 420, as shown in FIG. 15F. FIG. 16 depicts an embodiment of p-side up LED 426 with roughened substrate 420 having metal posts 428 formed above the substrate.

FIGS. 17A-F depict an embodiment for making a roughened surface substrate 420 with reflective layer 422 under metal posts 428. The steps depicted in FIGS. 17A-F are similar to the steps depicted in FIGS. 11A-E with the addition of the roughening step. FIG. 17A depicts an embodiment of substrate 420. FIG. 17B depicts roughening of substrate 420 using a dry and/or wet etching process. Reflective layer 422 is formed over substrate 420, as shown in FIG. 17C. Mask 432 is formed on reflective layer 422, as shown in FIG. 17D. With mask 432 on reflective layer 422, metal layer 434 is formed over the reflective layer and the mask, as shown in FIG. 17E.

Following deposition of metal layer 434, a lift off process is used to remove mask 432 and portions of metal layer 434 formed above the mask, as shown in FIG. 17F. The lift off process leaves posts 428 formed from metal layer 434 above reflective layer 422 on substrate 420. FIG. 18 depicts an embodiment of p-side up LED 426 with roughened substrate 420 having metal posts 428 formed above reflective layer 422 on the substrate.

In certain embodiments, posts and/or other structures are formed on the epitaxial structure prior to bonding the epitaxial structure to the permanent substrate with the adhesive layer. FIGS. 19A-E depict an embodiment for making an epitaxial structure with protrusions on the undoped layer of the epitaxial structure. FIG. 19A depicts epitaxial structure 402 formed on first substrate 400. First substrate 400 may be, for example, a sapphire substrate. Epitaxial structure 402 may include undoped layer 404, first doped layer 406, light emitting layer 408, and second doped layer 410. Light emitting layer 408 may be, for example, a multiple quantum well layer. In certain embodiments, first doped layer 406 is an n-type doped layer and second doped layer 410 is a p-type doped layer. In some embodiments, portion 411 of the upper surface of second doped layer 410 is roughened by, for example, wet etching. First electrode 412 is formed on an upper surface of first doped layer 406. Second electrode 414 is formed on an upper surface of second doped layer 410.

As shown in FIG. 19A, undoped layer 404 may have a non-flat lower surface with protrusions 440 formed on the surface of the undoped layer. Protrusions 440 may be formed as part of undoped layer 404 during growth of the undoped layer on first substrate 400. In some embodiments, protrusions 440 are formed on the surface of first substrate 400 prior to growth of undoped layer 404.

After formation of epitaxial structure 402 on first substrate 400, the upper surface of the structure may be bonded to second substrate 416 with first adhesive layer 418, as shown in FIG. 19B. Second substrate 416 may be, for example, a glass substrate, sapphire, or other insulating material type substrate.

Following bonding to second substrate 416, first substrate 400 is removed from epitaxial structure 402, as shown in FIG. 19C. First substrate 400 may be removed using, for example, a laser lift-off (LLO) process. Removal of first substrate 400 exposes the surface of undoped layer 404 with protrusions 440.

The structure depicted in FIG. 19C is then bonded to third substrate 420 with second adhesive layer 424, as shown in FIG. 19D. Third substrate 420 may be, for example, a silicon substrate or other suitable thermally conductive substrate. Third substrate 420 may be the permanent substrate for epitaxial structure 402. Following bonding to third substrate 420, first adhesive layer 418 is removed from epitaxial structure 402 to remove the first adhesive layer and second substrate 416 from the epitaxial structure, as shown in FIG. 19E. In certain embodiments, third substrate 420 includes reflective layer 422. Reflective layer 422 may include distributed Bragg reflector (DBR), omni-directional reflector (ODR), silver, aluminum, titanium, and/or other reflective conducting materials. Second adhesive layer 424 may be an epoxy glue, wax, SOG (spin-on-glass), photo resist or monomer, polymer.

As shown in FIGS. 19D-E, protrusions 440 have a height that is the desired (selected) thickness of second adhesive layer 424. Protrusions 440 contact the surface of third substrate 420 (e.g., reflective layer 422) such that the protrusions define the distance between undoped layer 404 and the substrate. Protrusions 440 may maintain the distance between undoped layer 404 and third substrate 420 during the bonding process using second adhesive layer 424. Thus, the height of protrusions 440 may determine the thickness of second adhesive layer 424.

In some embodiments, posts, in addition to protrusions 440, are formed on the epitaxial structure prior to bonding the epitaxial structure to the permanent substrate with the adhesive layer. FIGS. 20A-F depict an embodiment for making an epitaxial structure with posts and protrusions on the undoped layer of the epitaxial structure. FIG. 20A depicts epitaxial structure 402 formed on first substrate 400. Undoped layer 404 has the non-flat lower surface with protrusions 440 formed on the lower surface of the undoped layer.

After formation of epitaxial structure 402 on first substrate 400, the upper surface of the structure may be bonded to second substrate 416 with first adhesive layer 418, as shown in FIG. 20B. Following bonding to second substrate 416, first substrate 400 is removed from epitaxial structure 402, as shown in FIG. 20C.

After removal of first substrate 400, posts 442 may be formed on the surface of undoped layer 404, as shown in FIG. 20D. Posts 442 may be formed of a metal such as aluminum, titanium, other suitable materials, and/or combinations thereof. In some embodiments, posts 442 are formed of the same material as undoped layer 404. Posts 442 may extend to a greater height than protrusions 440. In some embodiments, some or all of posts 442 extend from protrusions 440.

After formation of posts 442, the structure depicted in FIG. 20D is then bonded to third substrate 420 with second adhesive layer 424, as shown in FIG. 20E. Following bonding to third substrate 420, first adhesive layer 418 is removed from epitaxial structure 402 to remove the first adhesive layer and second substrate 416 from the epitaxial structure, as shown in FIG. 20F. In certain embodiments, third substrate 420 includes reflective layer 422.

As shown in FIGS. 20D-F, posts 442 have a height that is the desired (selected) thickness of second adhesive layer 424. Posts 442 contact the surface of third substrate 420 (e.g., reflective layer 422) such that the posts define the distance between undoped layer 404 and the substrate. Posts 442 maintain the distance between undoped layer 404 and third substrate 420 during the bonding process using second adhesive layer 424. Thus, the height of posts 442 determines the thickness of second adhesive layer 424.

In some embodiments, posts without protrusions are formed on the epitaxial structure prior to bonding the epitaxial structure to the permanent substrate with the adhesive layer. FIGS. 21A-F depict an embodiment for making an epitaxial structure with posts on the undoped layer of the epitaxial structure. FIG. 21A depicts epitaxial structure 402 formed on first substrate 400. In certain embodiments, undoped layer 404 has a flat lower surface.

After formation of epitaxial structure 402 on first substrate 400, the upper surface of the structure may be bonded to second substrate 416 with first adhesive layer 418, as shown in FIG. 21B. Following bonding to second substrate 416, first substrate 400 is removed from epitaxial structure 402, as shown in FIG. 21C.

After removal of first substrate 400, posts 442 may be formed on the surface of undoped layer 404, as shown in FIG. 21D. Posts 442 may be formed of a metal such as aluminum, titanium, other suitable materials, and/or combinations thereof. In certain embodiments, posts 442 are formed on a flat undoped layer 404. In some embodiments, posts 442 are formed of the same material as undoped layer 404.

After formation of posts 442, the structure depicted in FIG. 21D is then bonded to third substrate 420 with second adhesive layer 424, as shown in FIG. 21E. Following bonding to third substrate 420, first adhesive layer 418 is removed from epitaxial structure 402 to remove the first adhesive layer and second substrate 416 from the epitaxial structure, as shown in FIG. 21F. In certain embodiments, third substrate 420 includes reflective layer 422.

As shown in FIGS. 21D-F, posts 442 have a height that is the desired (selected) thickness of second adhesive layer 424. Posts 442 contact the surface of third substrate 420 (e.g., reflective layer 422) such that the posts define the distance between undoped layer 404 and the substrate. Posts 442 maintain the distance between undoped layer 404 and third substrate 420 during the bonding process using second adhesive layer 424. Thus, the height of posts 442 determines the thickness of second adhesive layer 424.

In certain embodiments, posts (e.g., posts 428 and/or posts 442 described above) are only positioned underneath contact pads (electrodes) of the epitaxial structure. FIG. 22 depicts a side-view representation of an embodiment of LED 426 with posts 428/442 located only under first electrode 412 and second electrode 414 on epitaxial structure 402. FIG. 23 depicts a top-view representation of the embodiment of LED 426 with posts 428/442 located only under first electrodes 412 and second electrodes 414 on epitaxial structure 402. As shown in FIGS. 22 and 23, locating posts 428/442 in adhesive layer 424 under only electrodes 412, 414 reduces the number of posts used and provides less light shielding than if additional posts are located under other areas of epitaxial structure 402.

Having less posts, however, may increase the possibility of cracking of layers in epitaxial structure 402 (e.g., undoped layer 404, first doped layer 406, light emitting layer 408, and/or second doped layer 410) during the bonding process. The layers may crack due to the high pressures (e.g., pressures above about 9.8 MPa) exerted on epitaxial structure 402 during the adhesive layer bonding process. In certain embodiments, posts 428/442 located under electrodes 412, 414 have larger widths than posts that would be located under other areas of epitaxial structure 402. Increasing the width of the posts may increase the strength of the posts and reduce the potential for cracking during the bonding process. Posts 428/442 located under electrodes 412, 414 may have widths (diameters) up to about the widths (diameters) of the electrodes. For example, posts 428/442 may have widths up to about 100 µm, up to about 80 µm, or up to about 60 µm. In certain embodiments, the total cross-sectional area of post 428/442 may be less than the total cross-sectional area of the overlying electrode 412 or 414.

Figure 24:
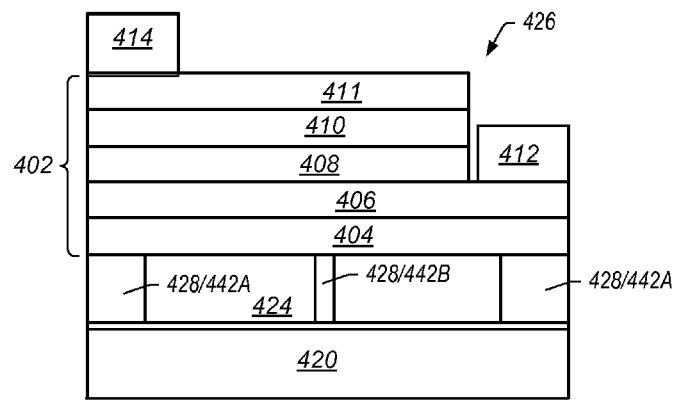
FIG. 24 depicts a side-view representation of an embodiment of an LED with wider posts under the electrodes and thinner posts under the rest of the epitaxial structure.
Figure 25:
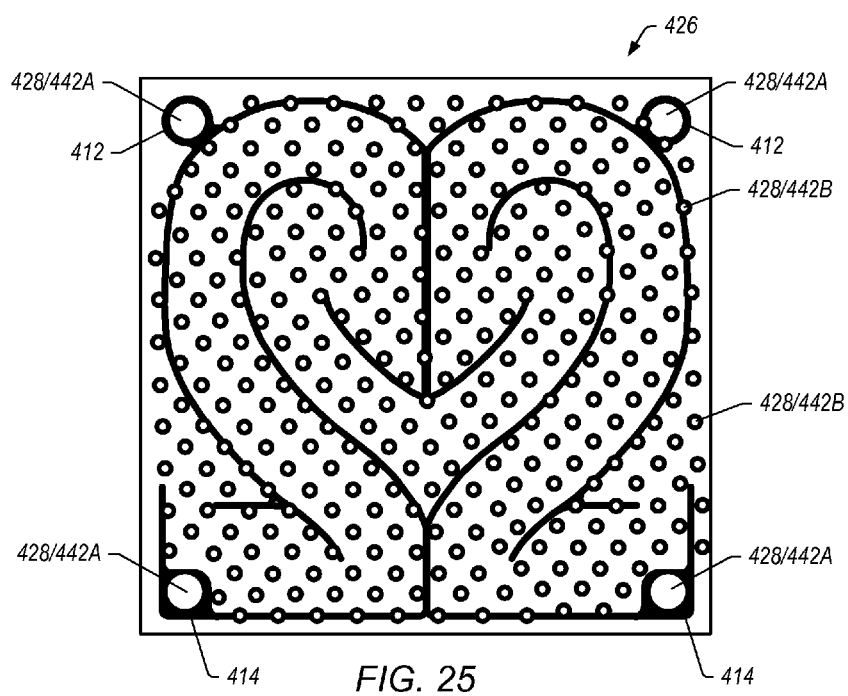
FIG. 25 depicts a top-view representation of an embodiment of an LED with wider posts under the electrodes and thinner posts under the rest of the epitaxial structure.

In certain embodiments, posts are positioned both underneath contact pads (electrodes) of the epitaxial structure and under other areas of the epitaxial structure. The posts underneath the electrodes may have larger widths than posts under other areas of the epitaxial structure. FIG. 24 depicts a side-view representation of an embodiment of LED 426 with posts 428/442A under electrodes 412, 414 and posts 428/442B under the rest of epitaxial structure 402. FIG. 25 depicts a top-view representation of the embodiment of LED 426 with posts 428/442A under electrodes 412, 414 and posts 428/442B under the rest of epitaxial structure 402.

As shown in FIGS. 24 and 25, locating wider posts 428/442A under electrodes 412, 414 increases the strength of the posts in areas where light shielding already occurs due to the electrodes and reduces the potential for cracking during the bonding process. Locating thinner posts 428/442B under the rest of epitaxial structure 402 reduces the light shielding area of the posts under the active (chip) area of the epitaxial structure. Providing both posts 428/442A and posts 428/442B reduces the potential for cracking of layers in epitaxial structure 402 during the bonding process while minimizing the light interference caused by posts under the chip area.

While posts 428/442A may have widths (diameters) up to about the widths (diameters) of their overlying electrodes, posts 428/442B under the chip area of epitaxial structure 402 may have widths (diameters) as small as possible depending on mask resolution during patterning processes used to form the posts. For example, posts 428/442B may have widths (diameters) of at most about 10 µm, at most about 5 µm, or at most about 3 µm. In certain embodiments, posts 428/442B have widths (diameters) between about 3 µm and about 5 µm. The size (width/diameter) and quantity of posts 428/442B may be selected based on, for example, the minimum amount of support needed to inhibit cracking of layers in epitaxial structure 402 during the bonding process and/or the minimum amount of shielding allowed in the adhesive layer by the posts. Thus, in certain embodiments, the total cross-sectional area of posts 428/442B provides a minimum area needed to inhibit cracking of layers in epitaxial structure 402 while maintaining as much light emission through the adhesive layer as possible.

Figure 26:
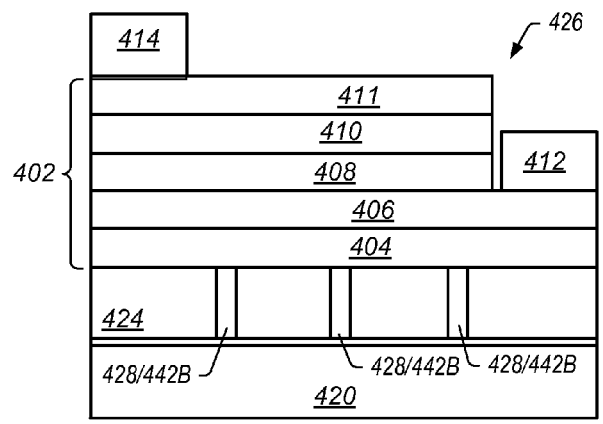
FIG. 26 depicts a side-view representation of an embodiment of an LED with posts located only under the chip area of the epitaxial structure.
Figure 27:
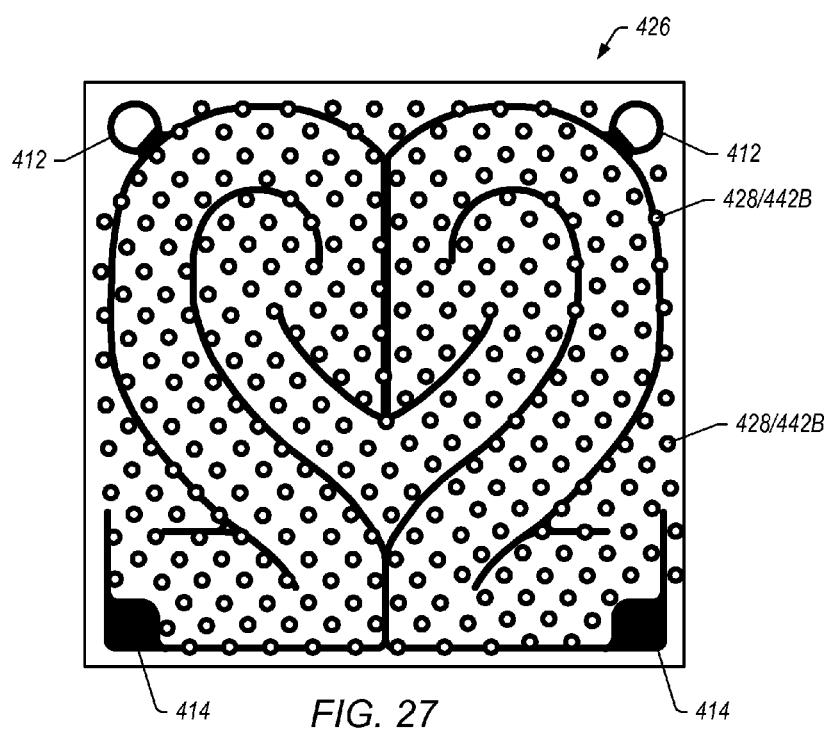
FIG. 27 depicts a top-view representation of the embodiment of an LED with posts located only under the chip area of the epitaxial structure.

In certain embodiments, posts are only positioned underneath the chip area of the epitaxial structure (not under the electrodes). FIG. 26 depicts a side-view representation of an embodiment of LED 426 with posts 428/442 located only under the chip area of epitaxial structure 402. FIG. 27 depicts a top-view representation of the embodiment of LED 426 with posts 428/442 located only under the chip area of epitaxial structure 402. As shown in FIGS. 26 and 27, locating posts 428/442 under only the chip area reduces the total number of posts and allows one size of post to be used while reducing the potential for cracking during the bonding process.

While FIGS. 7-27 depict embodiments for using posts in the adhesive layer during the process of making a p-side up LED, similar processes may be used in a process for making an n-side up LED. For example, similar methods may be used to couple posts to the substrates and/or the epitaxial structures used in making an n-side up LED (such as those shown in the embodiments depicted in FIGS. 6A-E). Thus, posts similar to those depicted in the above description can be formed in adhesive layer between the substrate and the epitaxial structure for n-side up LED 624 depicted in FIG. 6E.

In addition, any of the posts described above (e.g., posts 428 and/or posts 442) used in the adhesive layer may provide additional advantages to those advantages described above. For example, the posts may have a higher thermal conductivity than the material used in the adhesive layer. Thus, use of the posts in the adhesive layer may increase thermal conduction between the substrate and the epitaxial structure. Additionally, the posts may have reflective sidewalls that increase light transmission through the adhesive layer through light reflection.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor light emitting device, comprising:
   an epitaxial structure comprising a first type doped layer, a light emitting layer, and a second type doped layer;
   a substrate bonded to at least one surface of the epitaxial structure with an adhesive layer; and
   one or more posts located in the adhesive layer, wherein a height of one or more of the posts determines a thickness of the adhesive layer.

2. The device of claim 1, further comprising an undoped layer in the epitaxial structure.

3. The device of claim 1, wherein the posts are made of the same material as the substrate.

4. The device of claim 1, wherein the posts have been formed as part of the substrate.

5. The device of claim 4, wherein the substrate is a patterned substrate.

6. The device of claim 4, wherein the substrate is a patterned silicon substrate.

7. The device of claim 1, wherein the posts are made of a conductive metal.

8. The device of claim 1, wherein the posts are formed on the substrate prior to bonding the substrate to the epitaxial structure.

9. The device of claim 1, wherein the posts are formed on the epitaxial structure prior to bonding the epitaxial structure to the substrate.

10. The device of claim 9, wherein the epitaxial structure is grown from a patterned sapphire substrate.

11. The device of claim 1, wherein the posts have been formed as part of the epitaxial structure.

12. The device of claim 1, further comprising a reflective layer between the substrate and the adhesive layer.

13. The device of claim 12, wherein the reflective layer conforms to the surface of the substrate.

14. The device of claim 12, wherein the reflective layer conforms to the surface of the substrate and the posts.

15. The device of claim 12, further comprising at least one contact pad formed on at least one of the doped layers of the epitaxial structure, wherein the posts are located only under the contact pad.

16. The device of claim 12, further comprising at least one contact pad formed on at least one of the doped layers of the epitaxial structure, wherein the posts are located only under areas of the epitaxial structure without contact pads.

17. The device of claim 12, further comprising at least one contact pad formed on at least one of the doped layers of the epitaxial structure, wherein the posts located under the contact pad have larger widths than posts not under the contact pad.

18. A semiconductor light emitting device, comprising:
    an epitaxial structure comprising a first type doped layer, a light emitting layer, and a second type doped layer;
    a substrate bonded to at least one surface of the epitaxial structure with an adhesive layer; and
    one or more posts located in the adhesive layer, wherein the posts have been formed as part of the substrate.

19. A semiconductor light emitting device, comprising:
    an epitaxial structure comprising a first type doped layer, a light emitting layer, and a second type doped layer;
    a substrate bonded to at least one surface of the epitaxial structure with an adhesive layer; and
    one or more posts located in the adhesive layer, wherein the posts have been formed as part of the epitaxial structure.

* * * * *